United States Patent [19]

Croset et al.

[11] 3,805,210

[45] Apr. 16, 1974

[54] INTEGRATED CIRCUIT RESISTOR AND A METHOD FOR THE MANUFACTURE THEREOF

[76] Inventors: Michel Croset; Noel Nouailles, both of 101, Blvd. Murat, Paris 16 eme, France

[22] Filed: July 6, 1972

[21] Appl. No.: 269,420

[30] Foreign Application Priority Data

Dec. 4, 1969 France ........................69.41888

Related U.S. Application Data

[63] Continuation of Ser. No. 94,933, Dec. 3, 1970, abandoned.

[52] U.S. Cl. ........................ 338/308, 29/620, 156/8, 156/17, 204/38 A, 117/212

[51] Int. Cl. ............................................. H01c 7/00

[58] Field of Search ........... 338/308, 304; 117/212; 29/620; 204/38 R, 38 A, 38 S, 15; 174/68.5; 156/8, 17

[56] References Cited

UNITED STATES PATENTS

| | | | |
|---|---|---|---|
| 2,441,960 | 5/1948 | Eisler | 174/68.5 |
| 3,198,718 | 8/1965 | Quinn | 204/15 |
| 3,391,373 | 7/1968 | Altman | 338/308 |
| 3,257,592 | 6/1966 | Maissel | 204/38 A |
| 3,469,227 | 9/1969 | Canegallo | 338/308 X |
| 3,542,654 | 11/1970 | Orr | 204/38 R |
| 3,645,783 | 2/1972 | Rupert | 338/308 |

*Primary Examiner*—E. A. Goldberg
*Attorney, Agent, or Firm*—Cushman, Darby and Cushman

[57] ABSTRACT

The present invention relates to a method of manufacturing resistors integrated over a substrate made of a dielectric material.

6 Claims, 8 Drawing Figures

INTEGRATED CIRCUIT RESISTOR AND A METHOD FOR THE MANUFACTURE THEREOF

This is a continuation of Ser. No. 94,933 filed Dec. 3, 1970 now abandoned.

A layer 2 of oxidizable conductor material is deposited upon a substrate 1. A mask 9 having the shape of the resistor is deposited upon the layer 2. The material is then oxidised at the locations not protected by the mask.

Thus, the resistor is constituted by a pattern of conductor material embedded in a layer of an oxide of said material.

In order to produce an integrated circuit resistor, it is known to deposit a copper layer upon a dielectric substrate. Then, a layer of resistive material, generally tantalum, is deposited on this copper layer. Subsequently, using a mask containing a negative in the shape of the resistor which is to be produced, the copper is etched away through the tantalum layer. The copper and the tantalum which it carries, are removed from the unmasked areas.

The tantalum being torn, the shape of the resistor and its resistance value are not obtained with a sufficient degree of accuracy.

The object of the present invention is to provide an integrated resistor on a substrate, having a resistance value determined with a high degree of accuracy; another object is a method of manufacturing this resistor.

According to the present invention the resistor integrated, on a substrate made of dielectric material, comprises a pattern of conductive material extending through a layer of an oxide of this material.

The invention will be better understood from a consideration of the ensuing description, making reference to the attached drawings in which FIGS. 1 to 7 illustrate transverse sections of a resistor according to the invention various stages of manufacture.

Figure 8:
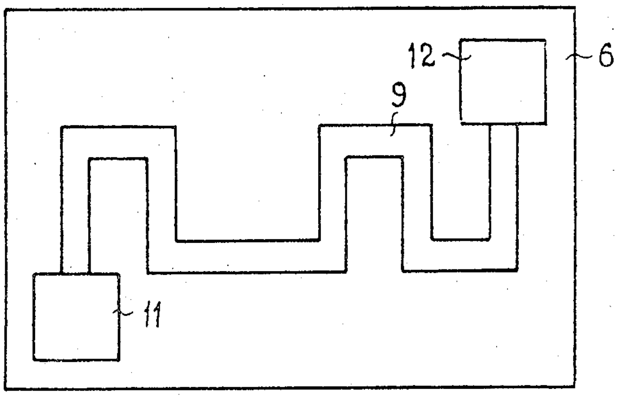

FIG. 8 is a plan view of the resistor in accordance with the invention.

FIGS. 1 to 4 relate to a first embodiment of the process according to the invention.

Figure 5:
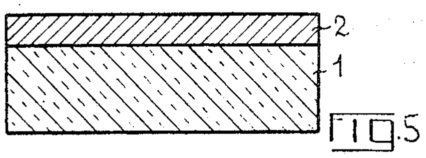
Figure 6:
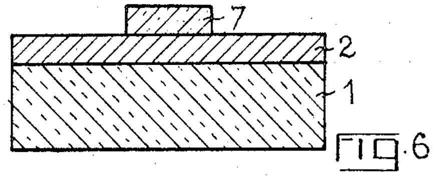
Figure 7:
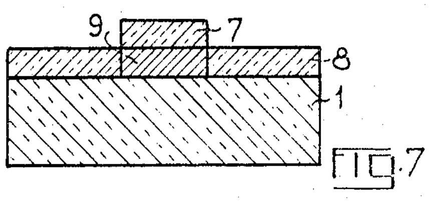

FIGS. 5 to 7 relate to a second embodiment of the process according to the invention.

FIG. 8 illustrates a plan view of a resistor in the final stage of its manufacture.

Figure 1:
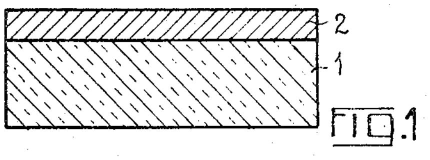

In FIG. 1, a silicon substrate 1 can be seen. A layer 2 of tantalum or tantalum nitride has been deposited on this substrate.

Figure 2:
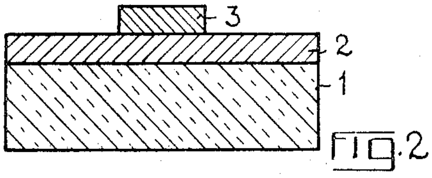

In FIG. 2, an aluminium layer 3 has been deposited upon the assembly through a mask having the shape of the resistor to be formed.

Figure 3:
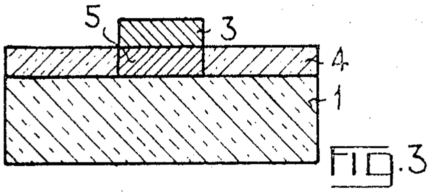

In FIG. 3, the unprotected parts of the layer 2 have been oxidised following heat treatment in an oxygen atmosphere at a temperature in the order of 500°C.

The tantalum oxide layer thus obtained is shown at 4. The non-oxidised part, that is to say that part of the layer which was protected against oxidation by the mask 3, is shown at 5.

Figure 4:
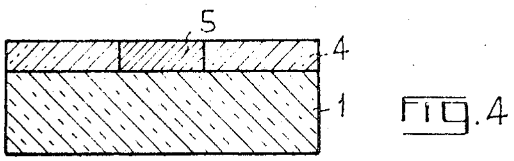

FIG. 4 shows the protective mask removed, after a selective etching by means of an appropriate acid.

The resistor is constituted by the zone 5. Its thickness corresponds to that of the layer 2 and its shape is determined with accuracy by that of the mask 3.

The resistor is thus constituted by a tantalum pattern embedded in a layer of tantalum oxide.

FIGS. 5 to 7 illustrate an element in the course of the various stages of manufacture of a second process according to this invention.

In FIG. 5, the substrate 1 of silicon dioxide has been covered with a layer 2 of tantalum.

In FIG. 6, through a mask, which has the shape of the resistor to be manufactured, a layer 7 of silicon dioxide has been deposited.

FIG. 7 shows the assembly after anodic oxidation. The silicon dioxide is not conductive so that oxidation will take place exclusively on the conductive part, that is to say on the tantalum layer. An oxide layer will be formed at 8 and the zones 9 protected by the mask will not be oxidised.

The result is identical to that of the first method. It is not necessary to eliminate the silicon layer.

FIG. 8 illustrates a plan view of the ultimate resistor.

This will be a pattern 9 of tantalum having the form of a greck shaped pattern, embedded in a tantalum oxide layer. Two conventional contacts 11 and 12 are provided at the extremeties of the resistor.

The invention has the advantage over known methods, that it is very much more accurate.

The thickness of the resistive layer is determined by the thickness of the initial layer. Moreover, the surplus tantalum is oxidised in situ and is not removed.

What we claim is:

1. A method of manufacturing a resistor integrated on a dielectric substrate, said resistor having a predetermined sinuous shape comprising the steps of i. depositing on said dielectric substrate in a predetermined thickness a layer of a conductor material having a substantial resistivity and oxidizable by chemical treatment to convert said material into an oxide thereof, said oxide having insulating properties;

ii. depositing upon said conductor layer by means of a mask, a protective layer resistant to said chemical treatment in the predetermined shape of the resistor to be formed;

iii. totally oxidizing by chemical treatment that portion of the conductor layer that is unprotected by said protective layer thereby converting the unprotected area of said conductive layer to an insulating oxide layer while the protected conductive layer forming the resistor is embedded in that insulating oxide layer in the predetermined shape of said protective layer;

thereby forming a resistor of said metal in a sinuous pattern on said dielectric substrate embedded in said insulating oxide layer.

2. A method as claimed in claim 1, including the additional step of iv. removing said protective layer applied in step (ii) by chemical etching.

3. A method as claimed in claim 2 wherein said protective layer of step (ii) is aluminum.

4. A method as claimed in claim 1, wherein said protective layer of step (ii) is silicon dioxide.

5. A method as claimed in claim 1, wherein said conductor material of step (i) is tantalum.

6. A resistor integrated upon a dielectric substrate including:

a dielectric substrate;

a layer of an insulating oxide of tantalum having substantial resistivity, said oxide having insulative properties and deposited on said dielectric substrate;

a resistor of tantalum having substantial resistivity embedded in said insulating oxide and directly deposited upon said dielectric substrate in a sinuous pattern.

* * * * *